United States Patent
Liikanen et al.

(10) Patent No.: US 11,423,989 B2
(45) Date of Patent: Aug. 23, 2022

(54) GENERATING EMBEDDED DATA IN MEMORY CELLS IN A MEMORY SUB-SYSTEM

(71) Applicant: Micron Technology, Inc., Boise, ID (US)

(72) Inventors: Bruce A. Liikanen, Berthoud, CO (US); Michael Sheperek, Longmont, CO (US); Larry J. Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 17/086,964

(22) Filed: Nov. 2, 2020

(65) Prior Publication Data

US 2022/0139460 A1 May 5, 2022

(51) Int. Cl.
*G11C 16/10* (2006.01)
*G11C 16/26* (2006.01)
*G06F 3/06* (2006.01)
*G11C 11/56* (2006.01)
*G11C 16/04* (2006.01)

(52) U.S. Cl.
CPC ............ *G11C 16/10* (2013.01); *G06F 3/0625* (2013.01); *G06F 3/0638* (2013.01); *G06F 3/0679* (2013.01); *G11C 16/26* (2013.01); *G11C 11/56* (2013.01); *G11C 16/0483* (2013.01)

(58) Field of Classification Search
CPC ......... G11C 16/10; G11C 16/26; G11C 11/56; G11C 16/0483; G06F 3/0625; G06F 3/0638; G06F 3/0679

USPC ........................................................ 711/154
See application file for complete search history.

(56) References Cited

U.S. PATENT DOCUMENTS

| | | |
|---|---|---|
| 2007/0285972 A1 | 12/2007 | Horii et al. |
| 2008/0037327 A1 | 2/2008 | Park et al. |
| 2010/0195397 A1 | 8/2010 | Hemink |
| 2016/0005491 A1 | 1/2016 | Yuan et al. |
| 2019/0341113 A1 | 11/2019 | Yip |
| 2021/0202012 A1* | 7/2021 | Han ................. G06F 3/0659 |
| 2021/0295921 A1* | 9/2021 | Suzuki ............. G11C 16/26 |

FOREIGN PATENT DOCUMENTS

| | | | | |
|---|---|---|---|---|
| CN | 102138183 A | * | 7/2011 | ......... G11C 11/5635 |
| CN | 109949848 A | * | 6/2019 | ......... G11C 11/4093 |

OTHER PUBLICATIONS

PCT Notification of Transmittal of the International Search Report and the Written Opinion of the International Searching Authority for PCT Application No. PCT/US2021/057614, dated Feb. 18, 2022, 11 pages.

* cited by examiner

*Primary Examiner* — Fernando Hidalgo
(74) *Attorney, Agent, or Firm* — Lowenstein Sandler LLP

(57) ABSTRACT

A processing device establishes a first data group of memory cells of a memory sub-system and a second data group of memory cells of the memory sub-system. A first portion of the first data group is programmed at a threshold voltage level to set a first embedded data value. A second portion of the second data group of memory cells is programmed at the threshold voltage level offset by an offset voltage level to set a second embedded data value.

20 Claims, 6 Drawing Sheets

US 11,423,989 B2

GENERATING EMBEDDED DATA IN MEMORY CELLS IN A MEMORY SUB-SYSTEM

TECHNICAL FIELD

Embodiments of the disclosure relate generally to memory sub-systems, and more specifically, relate to generating embedded data in memory cells in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
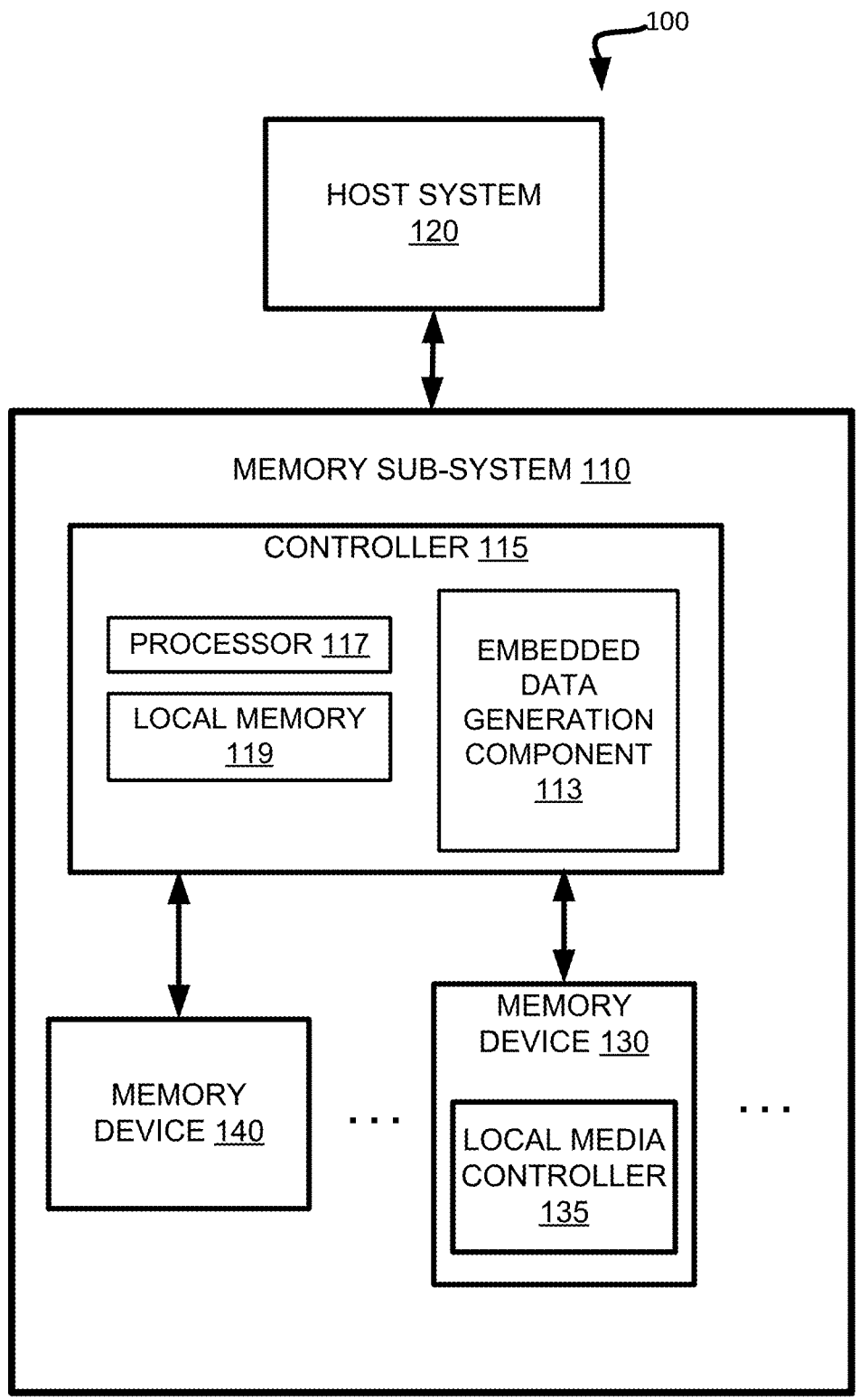
FIG. 1 illustrates an example computing environment that includes a memory sub-system in accordance with some embodiments of the disclosure.

Aspects of the present disclosure are directed to generating embedded data in memory cells in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. A non-volatile memory device can include a package of one or more dies. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that can be programmed to store information. Depending on the cell type, a cell can store one or more bits of binary information, and has various logic states that correlate to the number of bits being stored. The logic states can be represented by binary values, such as "0" and "1", or combinations of such values. A memory device can be made up of memory cells arranged in a two-dimensional grid. Memory cells are etched onto a silicon wafer in an array of columns (also hereinafter referred to as bit lines) and rows (also hereinafter referred to as word lines). A word line can refer to one or more rows of memory cells of a memory device that are used with one or more bit lines to generate the address of each of the memory cells. The intersection of a bit line and word line constitutes the address of the memory cell. A block hereinafter refers to a unit of the memory device used to store data and can include a group of memory cells, a word line group, a word line, or individual memory cells.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". However, due to physical constraints associated with the memory sub-system (e.g., the number and size of the physical blocks and memory cells), the data capacity within a memory sub-system is limited.

Aspects of the present disclosure address the above and other deficiencies by generating embedded data in memory cells of a memory sub-system, thus increasing the data capacity of the memory sub-system. In accordance with embodiments of the present disclosure, memory cells can be combined or organized in multiple different data groups. In an example, for a multi-plane memory sub-system having N planes, the memory cells within each respective plane can be combined to form a data group. In an embodiment, N data groups are formed, one for each of the N planes.

In an embodiment, a program targeting (PT) operation is executed to control the program verify (PV) target (e.g., a threshold voltage (Vt)) of the memory cells to establish multiple programming voltage distributions of the memory sub-system. A PV target can refer to voltage value used to program a memory cell at a given level. The PV target can set a threshold voltage (Vt) (e.g., minimum voltage at which a memory cell turns on or is conductive) of the memory cell. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

In an embodiment, a first data group (e.g., data group 1) is programmed at a programming voltage distribution level (e.g., L1) with zero offset to the threshold voltage level, thus setting a first embedded data value (e.g., a "0" value) for the first data group. In an embodiment, the second data group (adjacent to the first data group) is programmed at a programming voltage distribution level with a certain voltage offset to the threshold voltage level, thus setting a second embedded data value (e.g., a "1" value) for the second data group. Adjacent pairs of data groups include a data group without the voltage offset and a data group with the voltage offset to enable the discrimination of associated threshold voltage levels at a transition point or level between the data groups. Accordingly, in an embodiment, a voltage offset can be applied to alternating data groups (e.g., a second data group, a fourth data group, a sixth data group, an eighth data group, etc.).

In an embodiment, a data group programmed without the voltage offset represent an embedded data value of "0". A data group programmed with the voltage offset represent an embedded data value of "1". In an embodiment, a read operation can be executed to read the first data group and the second data group (e.g., an adjacent pair of data groups). Advantageously, the threshold voltage levels of the first data group and the second data group are compared to one another to identify the voltage offset between the two groups. In view of the comparison of an adjacent group pair (e.g., the first group and the second group), the embedded data value of the first group (without the offset) and the embedded data value of the second group (with the offset) are determined. For example, an average of the threshold voltage of the memory cells in the first group can be compared to an average of the threshold voltage of the memory cells in the second group. The comparison of the average threshold values shows a difference representative of the voltage offset (as applied to the second group). As such, the corresponding embedded data values (e.g., the "0" value of the first data group and the "1" value of the second data group) are determined in view of the comparison and the identification of the data group programmed without the voltage offset (e.g., having an embedded data value of "0") and the data group programmed with the voltage offset (e.g., having an embedded data value of "1"). Accordingly, the data capacity of the memory sub-system is expanded by programming an embedded or additional data value for multiple groups of memory cells in a memory sub-system.

Therefore, advantages of the systems and methods implemented in accordance with some embodiments of the present disclosure include, but are not limited to, increasing the data capacity of a memory sub-system. Generating adjacent groups of memory cells having threshold voltage levels that are offset relative to one another establishes a transition enables the implementation of the embedded data based on establishing voltage offsets between groups of memory cells to produce transition level between the two groups to enable the embedded data values to be determined. Advantageously, in addition to the data values programmed for each individual memory cells, each of the multiple groups of memory cells can represent an additional data value, thereby increasing the data capacity of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes an embedded data generation component 113 to generated embedded data based on threshold voltage offsets between different groups of memory cells in a memory sub-system. In an embodiment, the embedded data generation component 113 establishes multiple groups of memory cells (also referred to as a "data group" or "data group of memory cells"). In an embodiment, the memory cells in each memory plane (e.g., in a multi-plane memory sub-system) or each block can be combined to form a data group. Data is embedded by the embedded data generation component 113 by programming a first data group at a threshold voltage level (without offset) to set a first data bit value for the first data group. The embedded data generation component 113 programs a second data group (e.g., a data group adjacent to the first data group) with an offset relative to the threshold voltage level (herein the "threshold voltage offset level").

In an embodiment, the offset value of the threshold voltage offset level is set to a value that is small relative to the threshold voltage margin to maintain multiple distinct programming voltage distribution levels of the memory sub-system, while enabling the embedded data generation component 113 to discriminate one data group from another data group.

In an embodiment, the embedded data generation component 113 can execute a read operation of multiple data groups and compare the threshold voltage levels of adjacent groups to read the corresponding embedded data bit values associated with the respective groups. In an embodiment, each data group without the offset (e.g., data groups programmed at the threshold voltage level) represent an embedded data bit value of zero. In an embodiment, each data group with the offset (e.g., data groups programmed at the threshold voltage offset level) represents an embedded data bit value of one.

In an embodiment, the embedded data generation component 113 determines an average threshold voltage level for each data group. In an embodiment, the embedded data generation component 113 compares the average threshold voltage level of data groups that have the voltage offset (e.g., programmed at the threshold voltage offset level) with the average threshold voltage level of a data group that does not have the voltage offset (e.g., programmed at the threshold voltage level) to determine the corresponding embedded data value (e.g., a value of "0" for the data group without the voltage offset and a value of "1" for the data group with the voltage offset.) In an embodiment, the average threshold voltage level can be determined with windowing around each expected programming level distribution to maintain the desired differences between the programming level distributions, as described in greater detail below.

In an embodiment, the embedded data generation component 113 programs a first set of alternating data groups (e.g., data group 1, data group 3, data group 5, etc.) of the multiple data groups are programmed at the threshold voltage level (e.g., the PV target). The embedded data generation component 113 programs a second set of alternating data groups (e.g., data group 2, data group 4, data group 6, etc.) of the multiple data groups are programmed at a threshold voltage offset level (e.g., the threshold voltage level offset by an offset voltage value). In an example including a four plane memory sub-system, a first data group is established including a first set of memory cells in a first plane (e.g. Plane 0) is programmed at the threshold voltage level (i.e., without the offset), a second data group (adjacent to the first data group) is programmed at the threshold voltage offset level (i.e., with the offset), a third data group is programmed at the threshold voltage level (i.e., without the offset), a fourth data group is programmed at the threshold voltage offset level (i.e., with the offset), and so on.

In an embodiment, the first data group and second data group are adjacent to one another and include multiple programming voltage distributions (e.g., L1 through L7). In an example, each respective programming distribution is programmed without the offset in the first data group and with the offset in the second data group. Accordingly, the threshold voltage level of the first data group and the second data group can be compared to one another during a read operation of the data groups and the offset in the threshold voltage level can be used to determine the corresponding embedded data value of the respective data groups (e.g., a value of "0" for a data group programmed without the offset and a value of "1" for a data group programmed with the offset).

Figure 2:
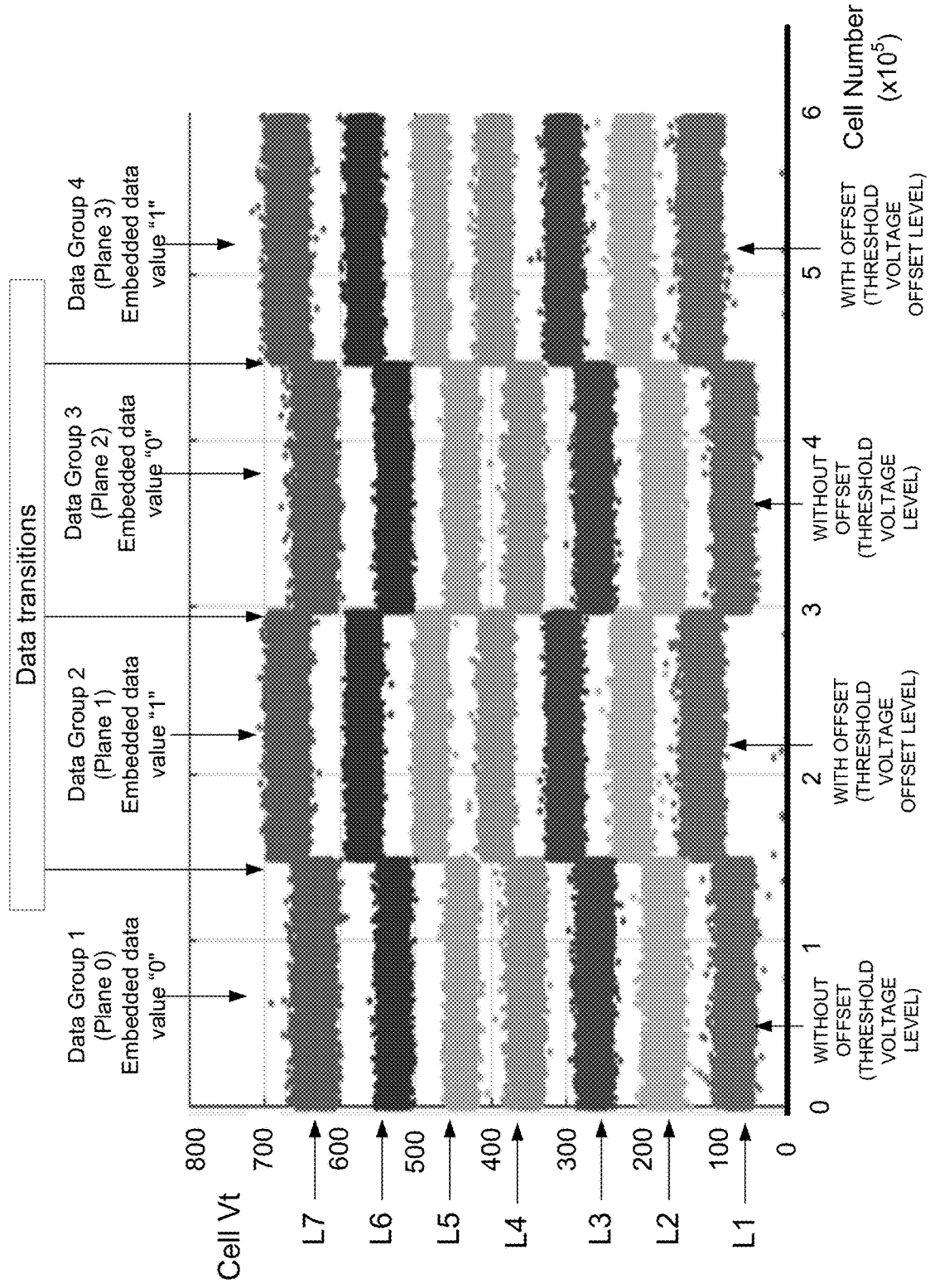
FIG. 2 illustrates example groups of memory cells with a set of the groups programmed with a voltage offset to enable the generation of embedded data values, in accordance with some embodiments of the disclosure.

FIG. 2 illustrates a multi-plane memory sub-system including multiple data groups (data group 1, data group 2, data group 3, and data group 4) established and programmed with alternating data groups programmed with an offset threshold voltage level, in accordance with some embodiments of the present disclosure. FIG. 2 illustrates a plot of multiple memory cells (designated by cell number on a scale of $10^5$) and corresponding threshold voltage (Vt) corresponding to multiple programming voltage distributions (L1 through L7). As shown in FIG. 2, multiple groups of cells (data groups 1 through 4) are established. In the example shown in FIG. 2, each group corresponding to a plane of the multi-plane memory sub-system, such that data group 1 includes the memory cells of Plane 0, data group 2 includes the memory cells of Plane 1, data group 3 includes the memory cells of Plane 2, and data group 4 includes the memory cells of Plane 3.

In an embodiment, data group 1 and data group 3 are programmed at a threshold voltage level (without an offset). The data group 2 and data group 4 are programmed at a voltage offset relative to the threshold voltage level (also referred to as a "threshold voltage offset level"). In an example, the voltage offset can be approximately a digital-to-analog converter (DAC) value of −40, such that the alternating data groups (e.g., data group 2 and data group 4) are programmed at a −40 DAC offset relative to the threshold voltage level of the adjacent data groups (e.g., data group 1 and data group 3). As shown, data transition levels are established between adjacent data groups, such that there is a first transition level between data group 1 and data group 2, a second transition level between data group 2 and data group 3, and a third transition level between data group 3 and data group 4. In an embodiment, a multi-plane threshold voltage sweep operation can be performed to identify the transition levels and discriminate between the adjacent data groups and their corresponding embedded data values. In an example, each data group includes a selected number of memory cells to enable discrimination between the data groups with the offset and data groups without the offset. In an example, each data group can include approximately 148,736 memory cells (e.g., approximately one quarter of a total number memory cells of the pages within a block).

In an embodiment, an average value of the threshold voltage for the memory cells in a group are average to generate a data group average threshold voltage level. In an embodiment, a read operation is performed on the multiple data groups (e.g., the four data group can be read as a single super block (e.g., a super block read operation for the multi-plane memory sub-system).

Figure 3:
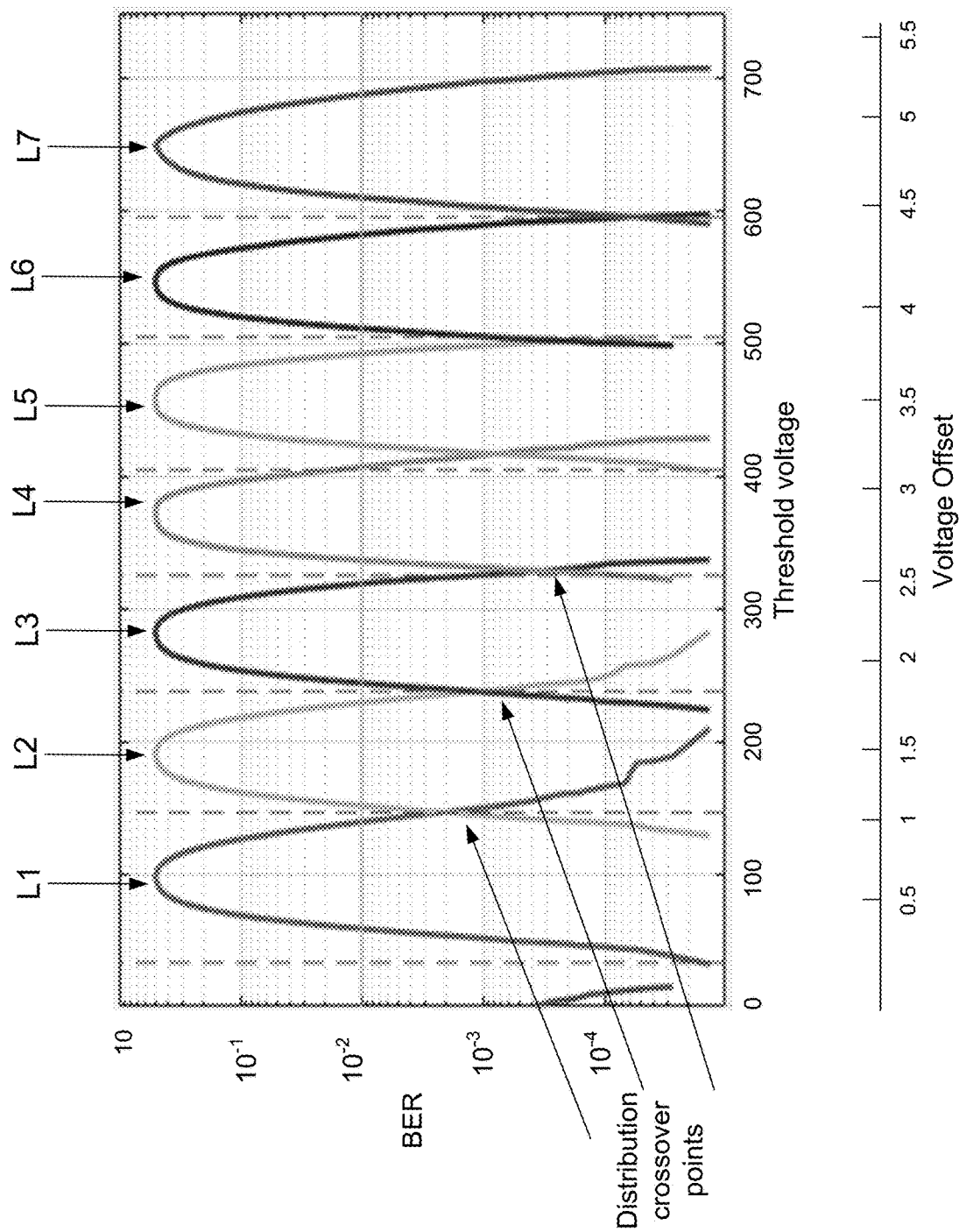
FIG. 3 is a flow diagram of an example programming voltage distributions and crossover points corresponding to selection of voltage offset value, in accordance with some embodiments of the disclosure.

In an embodiment, the voltage offset value can be selected to achieve a target bit error rate (BER) during normal operation for all pages within the block. In an embodiment, the target BER values can be identified in view of the crossover points of the programming voltage distributions (e.g., L1 through L7), as shown in FIG. 3.

In view of the voltage offset applied to alternating data groups, at each transition level, the difference in voltages corresponding to adjacent data groups can be used to identify corresponding embedded data values associated with each data group. In an embodiment, a read operation of the threshold voltage levels of multiple data groups can be executed. In view of the programming of alternating data groups with the voltage offset and without the voltage offset, transitions between the threshold voltages levels of the alternating data groups can be determined. In view of the comparison of an adjacent group pair (e.g., the first group and the second group), the embedded data value of the first group (without the offset) and the embedded data value of the second group (with the offset) can be identified in view of the read operation. As such, the corresponding embedded data values (e.g., the "0" value of the first data group and the "1" value of the second data group) are determined in view of the comparison and the identification of the data group programmed without the voltage offset (e.g., having an embedded data value of "0") and the data group programmed with the voltage offset (e.g., having an embedded data value of "1").

Figure 4:
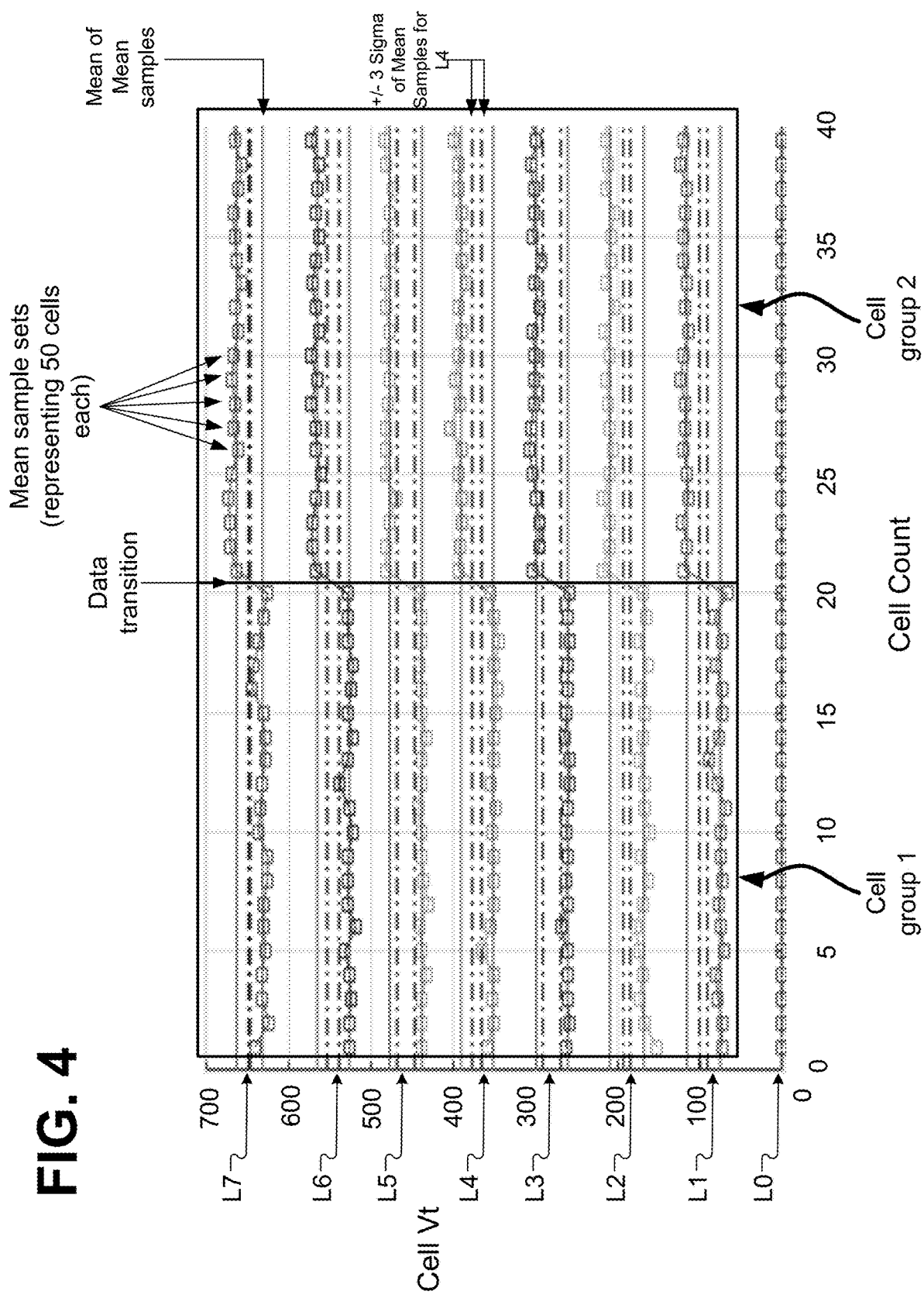
FIG. 4 illustrates an example programming voltage distribution level in a first data group and a second data group, where mean sample sets of memory cells are established in the respective data groups, in accordance with some embodiments of the disclosure.

FIG. 4 illustrates multiple programming voltage distributions (L1 through L7) of a pair of data groups (data group 1 and data group 2), generated in accordance with embodiments of the present disclosure. In an embodiment, an average of the threshold voltage values of a subset of memory cells within each data group is determined. As shown in FIG. 4, each subset of memory cells (denoted as squares in FIG. 4) are formed and an average or mean threshold voltage is calculated for the subset (also referred to as a "mean sample sets"). In an embodiment, generating the mean sample sets reduces the noise at the transition points to enable improved discrimination between the embedded data values corresponding to each data group. As shown, an offset between the threshold voltage levels of the mean samples at the transition point is observed, thereby enabling the discrimination of the different embedded data values of the cell groups. In this example, cell group 1 is programmed at a threshold voltage level without an offset and cell group 2 is programmed with an offset relative to threshold voltage level (e.g., the threshold voltage offset level). Cell group 1 (without the offset) represents an embedded data value of "0" and cell group 2 (with the offset) represents an embedded data value of "1".

In an embodiment, the number of memory cells to include in each mean sample set can be determined by analyzing threshold voltage sweep data at the transition point to determine a minimum number of memory cells needed to discriminate between cells written with the offset voltage and those written without the offset voltage. The number of cells in each mean sample set can be selected in order to attain a +/−three sigma separation value between programming voltage distribution levels in view of a target BER. For example, grouping approximately fifty cells in each mean sample set enables seven threshold voltage values corresponding to each of the programming voltage levels to be averaged with a target BER of approximately $6 \times 10^{-4}$.

Figure 5:
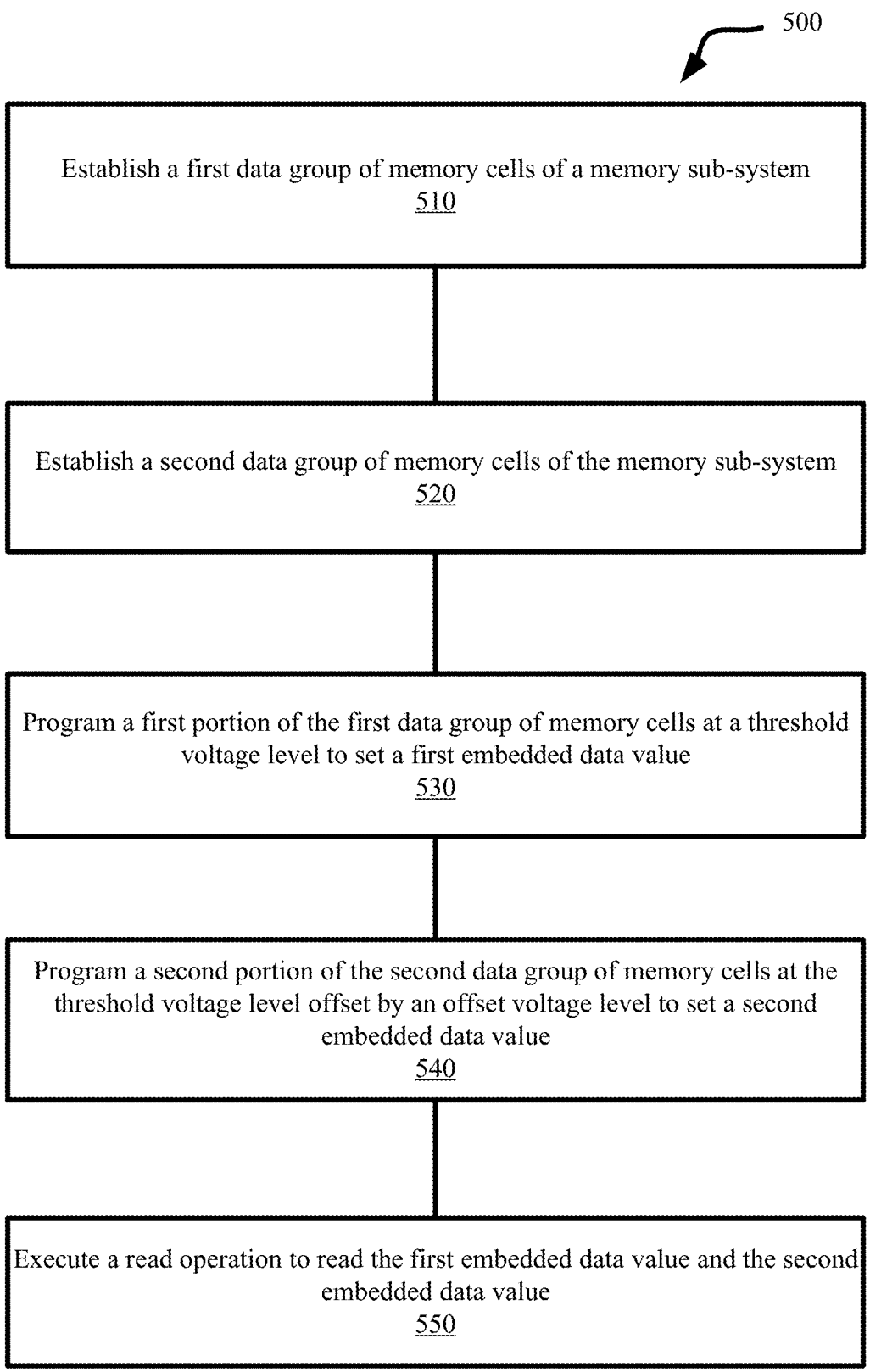
FIG. 5 is a flow diagram of an example method to generate embedded data values corresponding to respective data groups of memory cells, in accordance with some embodiments of the disclosure.

FIG. 5 of an example method 500 to generate and read embedded data corresponding to groups of memory cells of a memory sub-system, in accordance with some embodiments of the disclosure. The method 500 can be performed by processing device that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the embedded data generation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device establishes a first data group of memory cells of a memory sub-system. In an embodiment, the first group of memory cells can include the memory cells within a first block of a memory package or a first plane of a multi-plane memory sub-system or a first block of the memory sub-system. For example, in an embodiment, the first data group can include the memory cells within a first plane (e.g., Plane 0) of a four plane memory sub-system, wherein the first data group includes approximately one quarter of the total number of memory cells. In an example, the number of memory cells in the first data group can be approximately equal to a page size of a single memory block (e.g., 148,736 memory cells). As shown in FIG. 2, the first data group (e.g., data group 1) includes memory cells of Plane 0 with multiple programming voltage distributions (e.g., L1 through L7).

At operation 520, the processing device establishes a second data group of memory cells of the memory sub-system. For example, in an embodiment, the second data group can include the memory cells within a second plane (e.g., Plane 0) of a four plane memory sub-system or a second block of the memory sub-system, wherein the second data group includes approximately one quarter of the total number of memory cells.

At operation 530, the processing device programs a first portion of the first group of memory cells at a threshold voltage level to set a first embedded data value. In an embodiment, the memory cells in each respective programming voltage distribution level (e.g., L1 to L7) are programmed to a respective target threshold voltage level. For example, a portion of the memory cells (e.g., the portion of the memory cells in the first programming voltage distribution level of the first data group) is programmed with a first target threshold voltage level (e.g., the threshold voltage level corresponding to the first programming voltage distribution). The memory cells in the first group are programmed without an offset, and as such, are programmed at the threshold voltage level corresponding to the respective programming voltage distributions. Programming of the memory cells of the first data group at the threshold voltage level sets the first data group (i.e., the embedded data value of the first data group) to a value of "0". Accordingly, the first data group represents an embedded data value of "0" since it is programmed without a voltage offset.

At operation 540, the processing device programs a second portion of the second group of memory cells at a second threshold voltage level to set a second embedded data value. In an embodiment, the second threshold voltage level (also referred to as the threshold voltage offset level") is the first threshold voltage level offset by a voltage offset. For example, a portion of the memory cells (e.g., the memory cells in the first programming voltage distribution level of the second data group) is programmed with a voltage offset relative to the first target threshold voltage level (e.g., the threshold voltage level corresponding to the first programming voltage distribution). In an embodiment, the memory cells in the second group programmed with the voltage offset (i.e., the threshold voltage offset level) corresponding to the respective programming voltage distributions. As described above, programming of the memory cells of the second data group at the threshold voltage offset level enables the second data group to be discriminated from the first data group due to the voltage offset difference between the corresponding threshold voltages. Applying the threshold voltage offset level to the second data group sets the second data group (i.e., the embedded data value of the second data group) to a value of "1". Accordingly, the first data group represents an embedded data value of "1" since it is programmed with a voltage offset.

In an embodiment, the threshold voltage levels of the memory cells in each programming voltage distribution level (e.g., L1 through L7) of the first data group are averaged to generate a set of first average threshold voltage levels (without the offset). Accordingly, the set includes a first average threshold voltage level for each programming voltage distribution level of memory cells in the first data group. Similarly, in this embodiment, the threshold voltage offset levels of the memory cells of the second data group are averaged to generate a set of second average threshold voltage level (with the offset). Accordingly, the set includes a second average threshold voltage level for each programming voltage distribution level of memory cells in the first data group.

At operation 550, the processing logic executes a read operation to read the first embedded data value and the second embedded data value. In an embodiment, the read operation includes a comparison of the first average threshold voltage level corresponding to a first programming voltage distribution level of the first data group and the second average threshold voltage level corresponding to the first programming voltage distribution level of the second data group.

Figure 6:
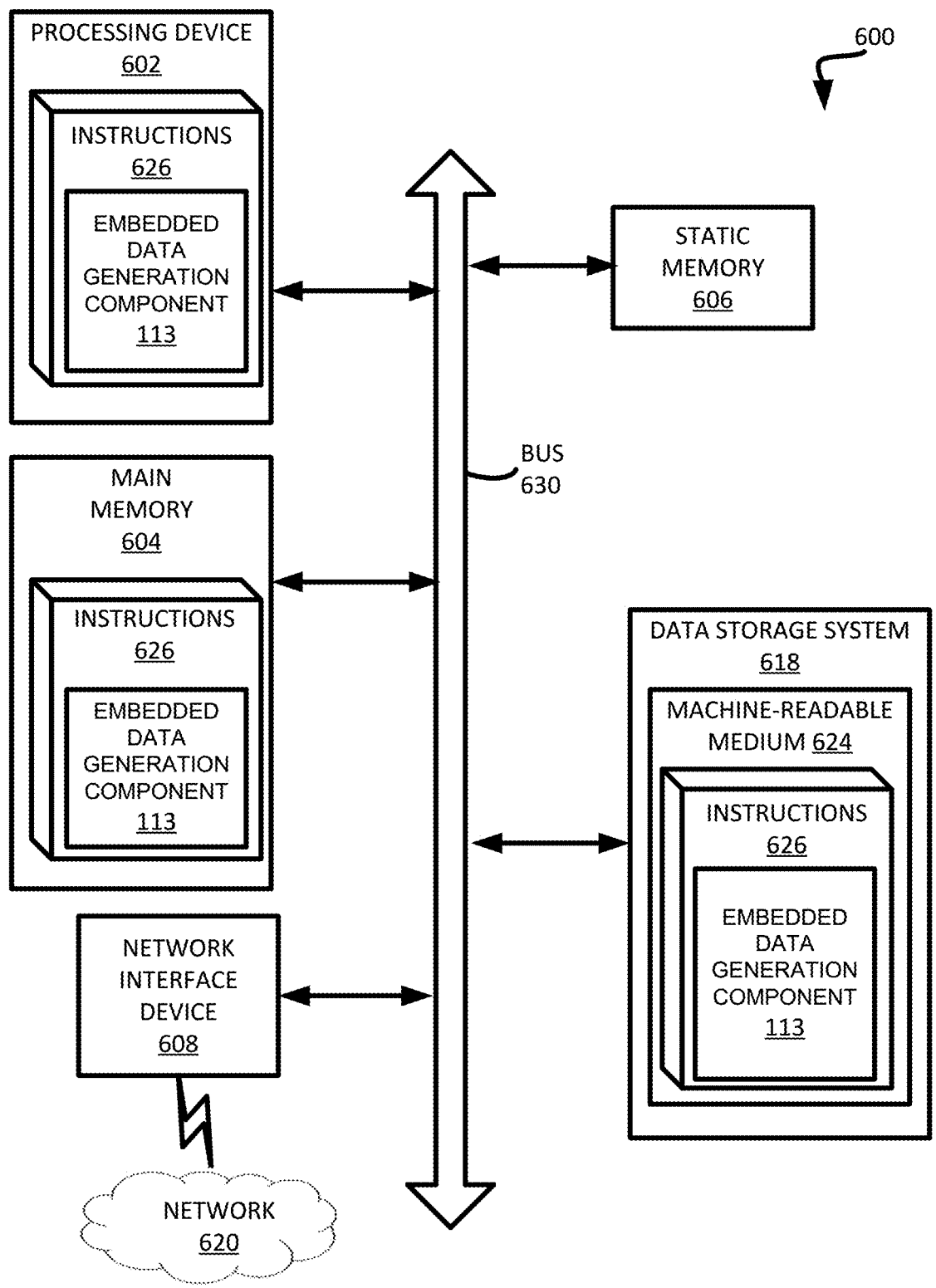
FIG. 6 illustrates an example machine of a computer system within which a set of instructions, for causing the machine to perform any one or more of the operations discussed herein, can be executed.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the embedded data generation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a non-transitory computer-readable storage medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the embedded data generation component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such.

One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    establishing, by a processing device, a first data group of memory cells of a first programming voltage distribution level associated with a memory sub-system;
    establishing a second data group of memory cells of the first programming voltage distribution level associated with the memory sub-system;
    programming a first portion of the first data group of memory cells at a threshold voltage level to set a first embedded data value, wherein the first portion of the first data group comprises a first plurality of memory cells in a first programming voltage distribution level; and
    programming a second portion of the second data group of memory cells at the threshold voltage level offset by an offset voltage level to set a second embedded data value, wherein the second portion of the second data group comprises a second plurality of memory cells in the first programming voltage distribution level.

2. The method of claim 1, further comprising executing a read operation to read the first embedded data value and the second embedded data value.

3. The method of claim 1, wherein the first portion of the first data group is programmed to a first value; and wherein the second portion of the second data group is programmed to a second value.

4. The method of claim 1, further comprising:
    determining a first average threshold voltage level of the first plurality of memory cells of the first portion of the first data group; and
    determining a second average threshold voltage level of the second plurality of memory cells of the second portion of the second data group; and
    comparing the first average threshold voltage level and the second average threshold voltage level to determine the first embedded data value and the second embedded data value.

5. The method of claim 1, wherein the first data group of memory cells programmed with the threshold voltage level represents the first embedded data value of 0; and wherein the second data group of memory cells programmed with the threshold voltage level represents the second embedded data value of 1.

6. The method of claim 1, further comprising:
    determining a target bit error rate corresponding to a crossover point of a first programming voltage distribution level and a second programming voltage distribution; and
    selecting a value of the offset voltage level corresponding to the crossover point at the target bit error rate.

7. The method of claim 1, further comprising:
calculating a predetermined separation value between a first programming voltage distribution level and a second programming voltage distribution level based on a target bit error rate; and
identifying, based on the predetermined separation value, a plurality of mean sample sets of the first data group.

8. The method of claim 1, further comprising:
establishing a third data group of memory cells of the memory sub-system;
programming a third portion of the third data group of memory cells at the first threshold voltage level to set a third embedded data value;
establishing a fourth data group of memory cells of the memory sub-system; and
programming a fourth portion of the fourth data group of memory cells at the threshold voltage level offset by the offset voltage level to set a fourth embedded data value.

9. A system comprising:
a memory device; and
a processing device, operatively coupled with the memory device, to perform operations comprising:
identifying a plurality of data groups of memory cells of a memory sub-system;
programming a voltage distribution level of a first set of alternating data groups of the plurality of data groups at a first threshold voltage to set a first embedded data value; and
programming the voltage distribution level of a second set of alternating data groups of the plurality of data groups at a second threshold voltage, wherein the second threshold voltage comprises a voltage offset relative to the first threshold voltage to set a second embedded data value.

10. The system of claim 9, the operations further comprising:
determining a first average threshold voltage level of a first data group of the first set of alternating data groups;
determining a second average threshold voltage level of a second data group of the second set of alternating data groups; and
comparing the first average threshold voltage level of the first data group to the second average threshold voltage level to determine the first embedded data value and the second embedded data value.

11. The system of claim 10, the operations further comprising:
calculating a first average threshold voltage value for the voltage distribution level of a first data group of the first set of alternating data groups; and
calculating a second average threshold voltage value for the voltage distribution level of a second data group of the second set of alternating data groups.

12. The system of claim 11, the operations further comprising executing a read operation to read the first average threshold voltage value and the second average threshold value.

13. The system of claim 11, the operations further comprising:
comparing the first average threshold voltage value and the second average threshold value to determine the first embedded data value and the second embedded data value;
determining a target bit error rate corresponding to a crossover point of the voltage distribution level and a second programming voltage distribution; and
selecting a value of the voltage offset corresponding to the crossover point at the target bit error rate.

14. A non-transitory computer-readable storage medium comprising instructions that, when executed by a processing device, cause the processing device to perform operations comprising:
establishing a first data group of memory cells of a memory sub-system;
establishing a second data group of memory cells of the memory sub-system;
programming a first portion of the first data group of memory cells at a threshold voltage level to set a first embedded data value, wherein the first portion of the first data group comprises a first plurality of memory cells in a first programming voltage distribution level; and
programming a second portion of the second data group of memory cells at the threshold voltage level offset by an offset voltage level to set a second embedded data value, wherein the second portion of the second data group comprises a second plurality of memory cells in the first programming voltage distribution level.

15. The non-transitory computer-readable storage medium of claim 14, the operations further comprising executing a read operation to read the first embedded data value and the second embedded data value.

16. The non-transitory computer-readable storage medium of claim 14, wherein the first portion of the first data group is programmed to a first value; and wherein the second portion of the second data group is programmed to a second value.

17. The non-transitory computer-readable storage medium of claim 16, the operations further comprising:
determining a first average threshold voltage level of the first plurality of memory cells of the first portion of the first data group; and
determining a second average threshold voltage level of the second plurality of memory cells of the second portion of the second data group; and
comparing the first average threshold voltage level and the second average threshold voltage level to determine the first embedded data value and the second embedded data value.

18. The non-transitory computer-readable storage medium of claim 14, wherein the first data group of memory cells programmed with the threshold voltage level represents the first embedded data value of 0; and wherein the second data group of memory cells programmed with the threshold voltage level represents the second embedded data value of 1.

19. The non-transitory computer-readable storage medium of claim 14, the operations further comprising:
determining a target bit error rate corresponding to a crossover point of a first programming voltage distribution level and a second programming voltage distribution; and
selecting a value of the offset voltage level corresponding to the crossover point at the target bit error rate.

20. The non-transitory computer-readable storage medium of claim 15, the operations further comprising:
establishing a third data group of memory cells of the memory sub-system;
programming a third portion of the third data group of memory cells at the first threshold voltage level to set a third embedded data value;
establishing a fourth data group of memory cells of the memory sub-system; and programming a fourth portion of the fourth data group of memory cells at the threshold voltage level offset by the offset voltage level to set a fourth embedded data value.

\* \* \* \* \*